(12) United States Patent
Hazama

(10) Patent No.: US 6,975,019 B2
(45) Date of Patent: Dec. 13, 2005

(54) SEMICONDUCTOR MEMORY DEVICE HAVING A MULTI-LAYERED INTERLAYER INSULATION CONSISTING OF DEUTERIUM AND NITRIDE

(75) Inventor: Hiroaki Hazama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/639,443

(22) Filed: Aug. 13, 2003

(65) Prior Publication Data

US 2004/0140510 A1 Jul. 22, 2004

(30) Foreign Application Priority Data

Nov. 6, 2002 (JP) ......................... 2002-322476

(51) Int. Cl.[7] ............................................. H01L 23/58
(52) U.S. Cl. ................. 257/637; 257/635; 257/296
(58) Field of Search ............................ 257/637, 635, 257/296

(56) References Cited

U.S. PATENT DOCUMENTS 6,670,241 B1 * 12/2003 Kamal et al. ............... 438/258

FOREIGN PATENT DOCUMENTS

| JP | 10-303303 | 11/1998 |
|----|-----------|---------|
| JP | 11-274489 | 10/1999 |
| JP | 11-284183 | 10/1999 |
| JP | 2000-77621 | 3/2000 |
| JP | 2002-118252 | 4/2002 |
| JP | 2002-298591 | 10/2002 |

* cited by examiner

*Primary Examiner*—Fetsum Abraham
(74) *Attorney, Agent, or Firm*—Oblon, Spivak, McClelland, Maier & Neustadt, P.C.

(57) ABSTRACT

A semiconductor memory device having a gate insulation film, comprising a semiconductor substrate; a memory cell array formed on the semiconductor substrate, the memory cell array including a plurality of memory cell transistors, each of which has the gate insulation film; a first interlayer insulation film covered the memory cell array and including deuterium; a silicon nitride layer formed above the first interlayer insulation film; and a second interlayer insulation film formed above the silicon nitride layer, and including deuterium, a density of deuterium in the first interlayer insulation film being higher than that of deuterium in the second interlayer insulation film.

28 Claims, 14 Drawing Sheets

SEMICONDUCTOR MEMORY DEVICE HAVING A MULTI-LAYERED INTERLAYER INSULATION CONSISTING OF DEUTERIUM AND NITRIDE

CROSS-REFERENCE TO RELATED APPLICATION

This application is based upon and claims the benefit of priority from the prior Japanese Patent Application No. 2002-322476, filed Nov. 6, 2002, the entire contents of which are incorporated herein by reference.

BACKGROUND OF THE INVENTION

1. Field of the Invention

This present invention relates to a semiconductor memory device and a manufacturing method thereof, for example, a nonvolatile semiconductor memory device and its manufacturing method.

2. Description of the Related Art

In a semiconductor device, it is important that a boundary between a silicon substrate and a silicon oxide layer thereon is stable. From this reason, a step of a hydrogen annealing is usually used at a manufacturing step of the semiconductor device in order to terminate a dangling bond of silicon that makes an interface state between a silicon substrate and a silicon oxide layer. At the step of the hydrogen annealing, a mixture gas of hydrogen and nitrogen is used to make a bond of Si—H, thereby making a density of the interface state lower. When a conventional nonvolatile semiconductor memory device is manufactured, the step of the hydrogen annealing is usually used.

However, it is becoming clear that even though the hydrogen annealing is used to an EEPROM that includes a tunnel oxide film (a gate oxide film), a worse characteristic thereof can not be avoided. A rewrite operation of the EEPROM is achieved by injecting electrons from a semiconductor substrate to a floating gate, or emitting electrons from a floating gate to a semiconductor substrate by FN tunneling effect or hot carrier injection effect. However, energy of Si—H bond in the tunnel oxide film is relatively low, and the Si—H bond in the tunnel oxide film can be cut due to repeating the rewrite operation, thereby resulting in a worse characteristic thereof.

On the other hand, instead of the hydrogen annealing, a variety of steps of manufacturing a semiconductor device with the deuterium annealing are proposed. For example, it is proposed that deuterium bonds (Si—H) are formed at an interface between a gate electrode and a gate oxide nitride layer, thereby making characteristics of an insulating break resistance better (See Japanese laid open koukai Hei 11-274489). It is also proposed that deuterium is injected at an interface between a gate insulating film and a silicon substrate, thereby preventing a damage of the gate insulating film (See Japanese laid open koukai Hei 11-284183). It is also proposed that, in a device that includes a transistor and a high dielectric capacitor, deuterium is injected at an interface between a gate insulating film and a silicon substrate, thereby making a threshold voltage of the transistor and a retention characteristics of the high dielectric capacitor better (See Japanese laid open koukai 2000-77621). And also, it is proposed that deuterium is injected after forming a gate insulating film that includes nitrogen or metal, thereby preventing an occurrence of electron traps that is caused by hot electrons (See Japanese laid open koukai 2002-118252).

Recently, a memory cell array in a NAND type EEPROM is covered with a silicon nitride layer (SiN) in order to form contact holes that are connected to a bit line. The silicon nitride layer (SiN) includes a lot of Si—H bonds and/or N—H bonds. When a thermal step is done with high temperature that is more than temperature at which the silicon nitride layer (SiN) is deposited, the Si—H bonds and the N—H bonds in the silicon nitride layer (SiN) can be cut, and atomic hydrogen is emitted from the silicon nitride layer (SiN). Thereby, the tunnel oxide film under the silicon nitride layer SiN is resolved by the atomic hydrogen emitted from the silicon nitride layer, and a number of Si—H bond in the tunnel oxide film increases. The Si—H bonds in the tunnel oxide film would cause a worse characteristic of the memory cell transistor, if the rewrite operation was done repeatedly.

SUMMARY OF INVENTION

A first aspect of the present invention is a semiconductor memory device having a gate insulation film, comprising: a semiconductor substrate; a memory cell array formed on the semiconductor substrate, the memory cell array including a plurality of memory cell transistors, each of which has the gate insulation film; a first interlayer insulation film covered the memory cell array and including deuterium; a silicon nitride layer formed above the first interlayer insulation film; and a second interlayer insulation film formed above the silicon nitride layer, and including deuterium, a density of deuterium in the first interlayer insulation film being higher than that of deuterium in the second interlayer insulation film.

A second aspect of the present invention is providing a semiconductor memory device having a gate insulation film, comprising: a semiconductor substrate; a memory cell array formed on the semiconductor substrate, the memory cell array including a plurality of memory cell transistors, each of which has the gate insulation film, a floating gate formed on the gate insulating film, a control gate adjacent to the floating gate; a first interlayer insulation film covered the memory cell array and including deuterium; a silicon nitride layer formed above the first interlayer insulation film; a second interlayer insulation film formed above the silicon nitride layer, and including deuterium, a density of deuterium in the first interlayer insulation film being higher than that of deuterium in the second interlayer insulation film; and a bit line formed above the second interlayer insulation film.

A third aspect of the present invention is providing a method of manufacturing a semiconductor memory device having a gate insulation film, comprising; forming a memory cell array on a semiconductor substrate, the memory cell array including a plurality of memory cell transistors; forming a silicon nitride layer so as to cover the memory cell array including a plurality of memory cell transistors; annealing with an oxidation atmosphere the semiconductor substrate on which the memory cell are formed and above which the silicon nitride layer are formed; and annealing with a deuterium atmosphere the semiconductor substrate on which the memory cell are formed and above which the silicon nitride layer are formed.

DETAILED DESCRIPTION OF THE INVENTION

Hereinafter, we will explain a first embodiment of the present invention with reference to drawings.

Figure 1:
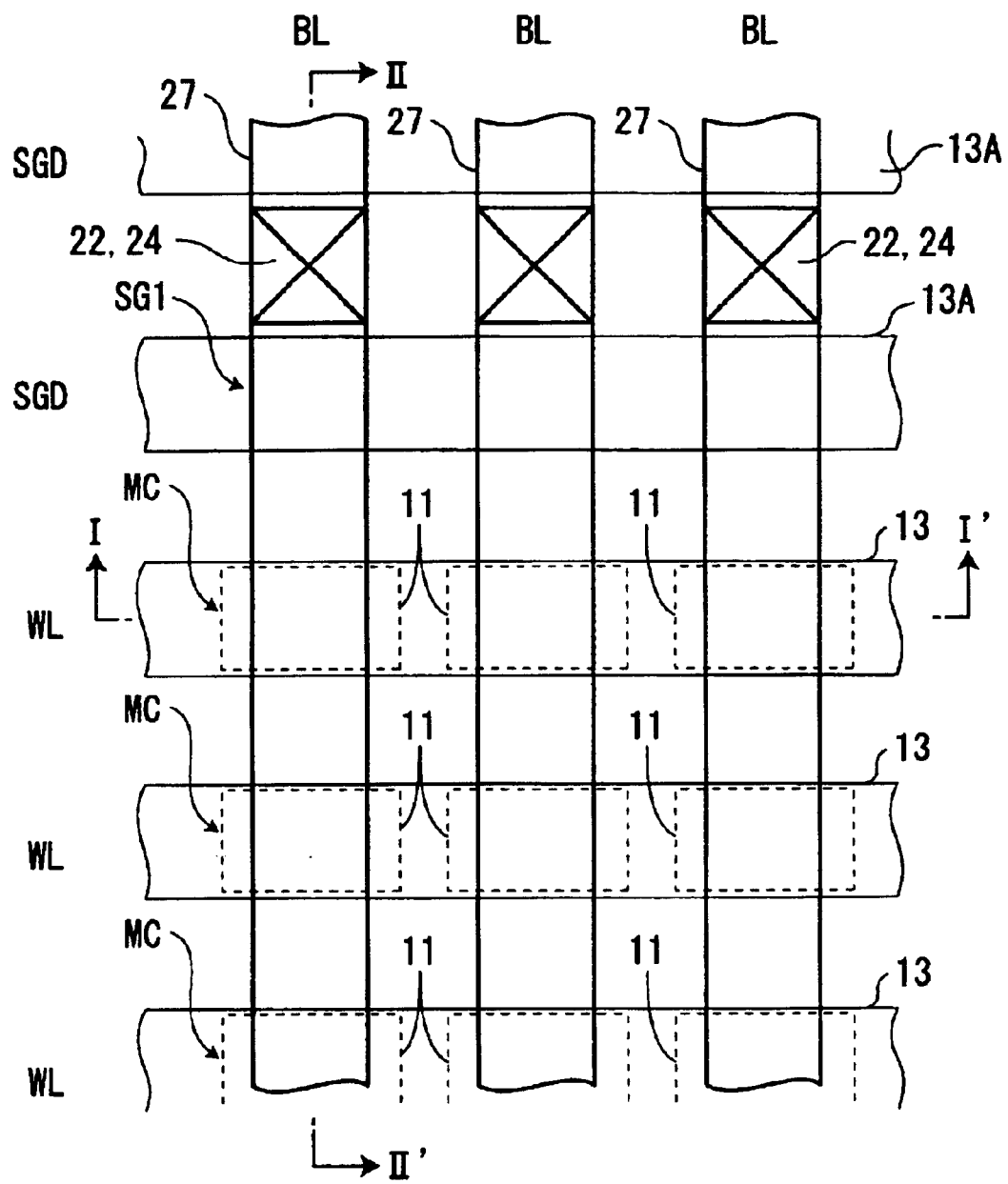
FIG. 1 shows a layout diagram of EEPROM memory cell array of one embodiment in the present invention.

FIG. 1 shows a schematic layout diagram of a memory cell array that is included in a NAND type EEPROM in the first embodiment of the present invention. Word lines (WL) 13 and bit lines (BL) are allocated so as to intersect each other. A memory cell is allocated at a portion where the word line intersects the bit line. As will be mentioned afterward, a plurality of memory cells (MC) that are arranged in a direction that the bit line is allocated, are connected in series and constitutes a NAND unit. One end of the NAND unit is connected to the bit line via a select transistor SG1. Other end of the NAND unit is connected to a source line via a select transistor (not shown). A select gate line (SDG) 13A is arranged in parallel with the word lines (WL) and intersects the bit lines (BL). A select gate transistor SG1 is arranged at a portion where the select gate line (SDG) intersects the bit line.

Figure 2:
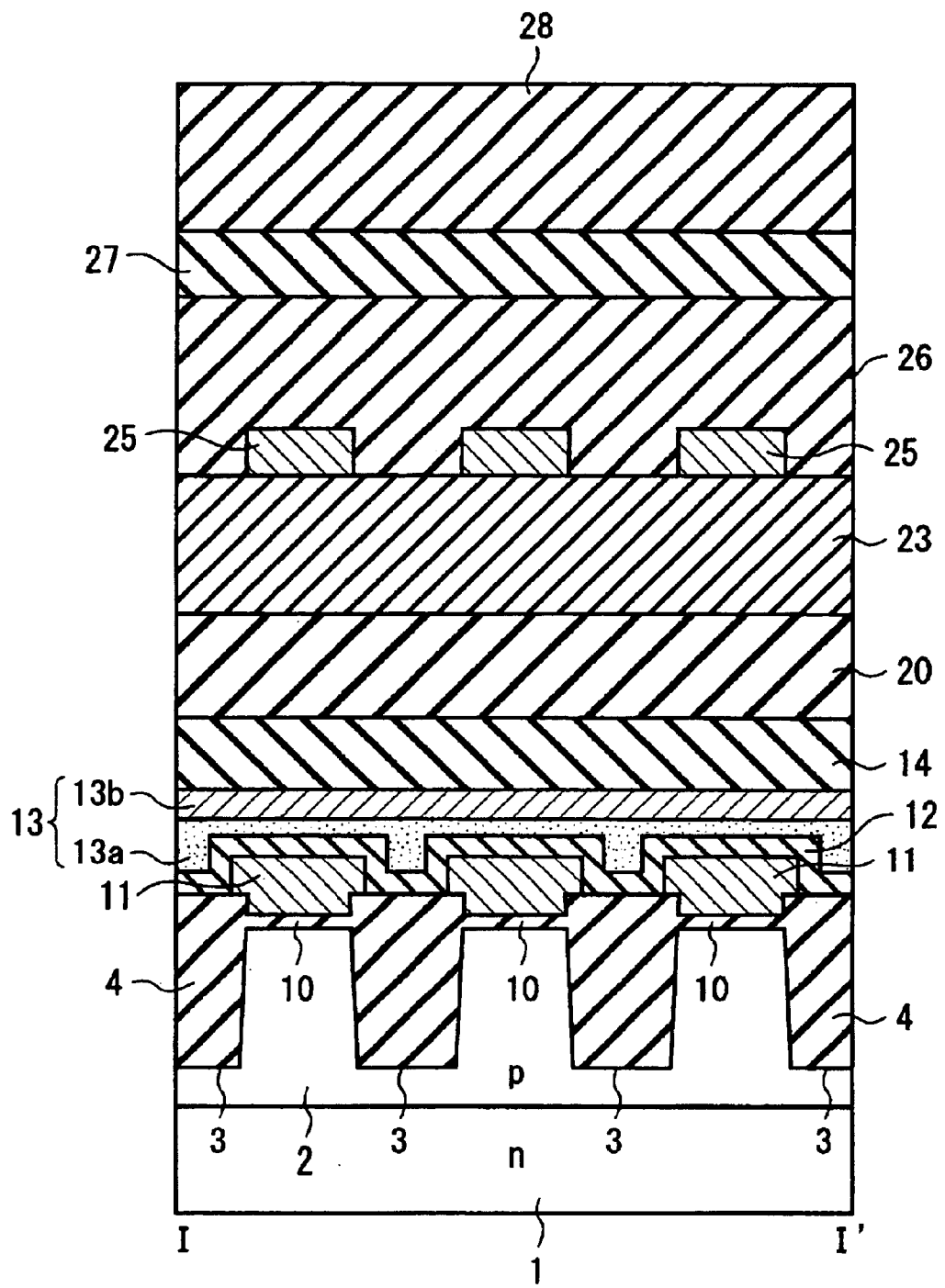
FIG. 2 shows a I–I' cross sectional view of the FIG. 1.
Figure 3:
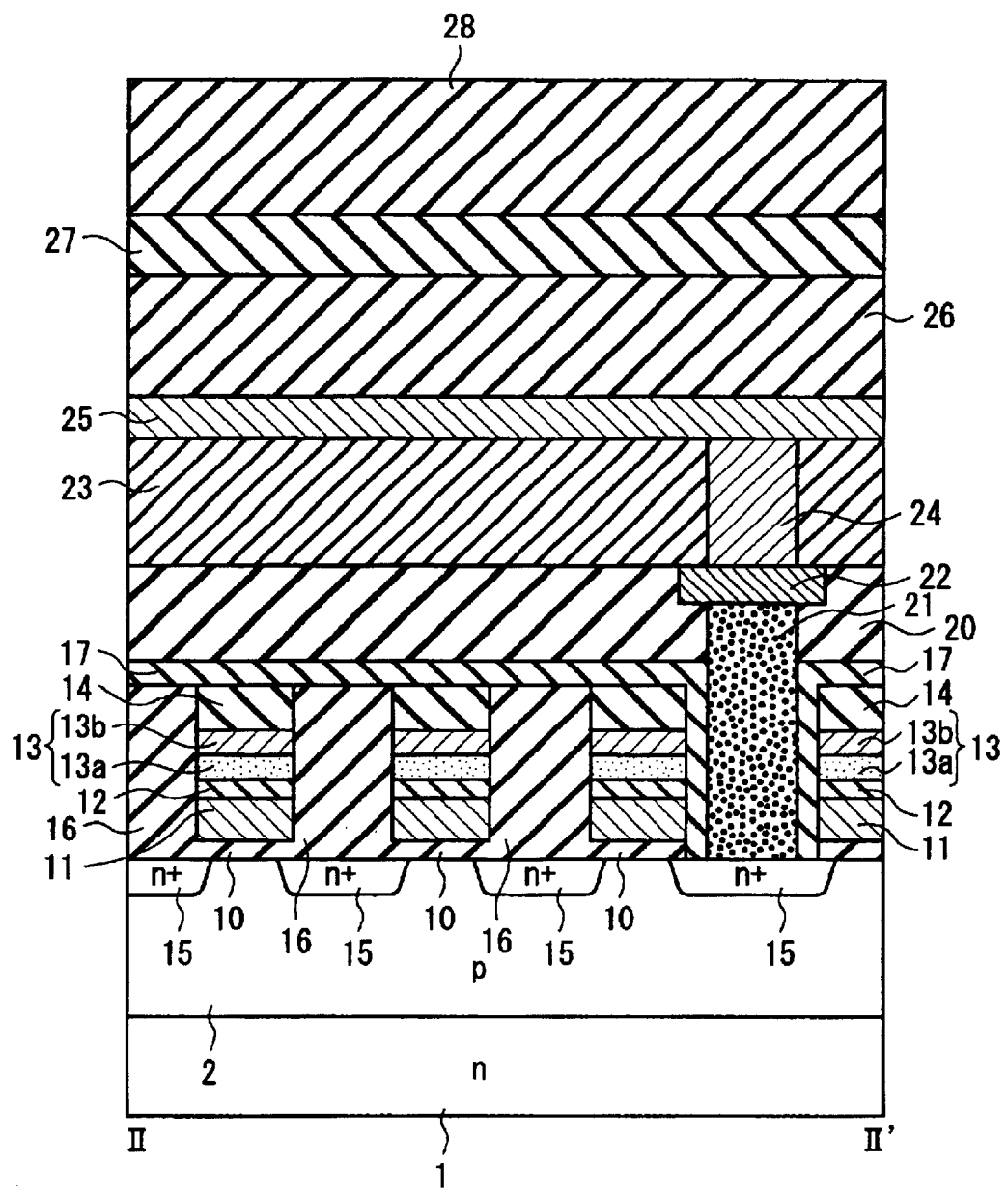
FIG. 3 shows a II–II' cross sectional view of the FIG. 1.

FIG. 2 shows a cross sectional view of a I–I' along with the word line depicted in FIG. 1. FIG. 3 shows a different cross sectional view of a II–II' along with the bit line depicted in FIG. 1. As shown in FIGS. 2 and 3, a p-type well 2 in a cell array region on a semiconductor substrate 1 is formed. Each of element regions in which the NAND unit is formed is electrically separated each other by a element isolation insulation layer 4. A floating gate 11 that is made of a poly crystalline silicon is formed on a tunnel oxide film 10 that is formed on the semiconductor substrate 1. A control gate 13 is formed on the insulation film 12 that is formed on the floating gate 11. The control gate 13 is including a laminated layer that is comprised of a poly crystalline silicon 13a and a tungsten silicide layer 13b (WSi). A part of the control gate 13 is used as the word line.

Parts of the control gate 13 and the floating gate 11 are removed and patterned by using the silicon nitride layer 14 (SiN layer) as a mask at a same time. Ion implantation step is done by using the patterned control gate 13 and the patterned floating gate 11 as a mask, thereby forming source and drain diffusion layers 15. The diffusion layer 15 is used commonly among the adjacent memory cells. A plurality of the memory cells connected in series are consisting the NAND unit.

As shown in FIG. 3, an interlayer insulation layer 16 is formed among gate electrodes each of which includes the control gate 13 and the floating gate 11. A silicon nitride layer 17 (SiN layer) is formed so as to cover the memory cell array. As will be mentioned afterward, a step of a deuterium annealing is done after a step of forming the silicon nitride layer 17 to cover the memory cell array and before a step of forming metal lines.

An interlayer insulation layer 20 is formed on the silicon nitride layer 17. A contact plug 21 and a tungsten (W) layer 22 are formed in the interlayer insulation layer 20. An interlayer insulation layer 23 is formed on the interlayer insulation layer 20. A contact plug 24 is formed in the interlayer insulation layer 23. A bit line (BL) 25 that is made of Aluminum is formed on the interlayer insulation layer 23 and the contact plug 24. FIG. 3 shows a contact portion at the one end of the NAND unit near the bit line, and the tungsten layer (W) 22 is used as an intermediate line. However, a source line (not shown) is arranged at the other end of the NAND unite, and is formed in a same layer as the tungsten layer (W) 22.

A silicon oxide layer 26, a silicon nitride layer 27, and a poly imide layer 28 that are used as a passivation layer, are formed on the bit line 25 by using a CVD (Chemical Vapor Deposition) method.

Figure 4:
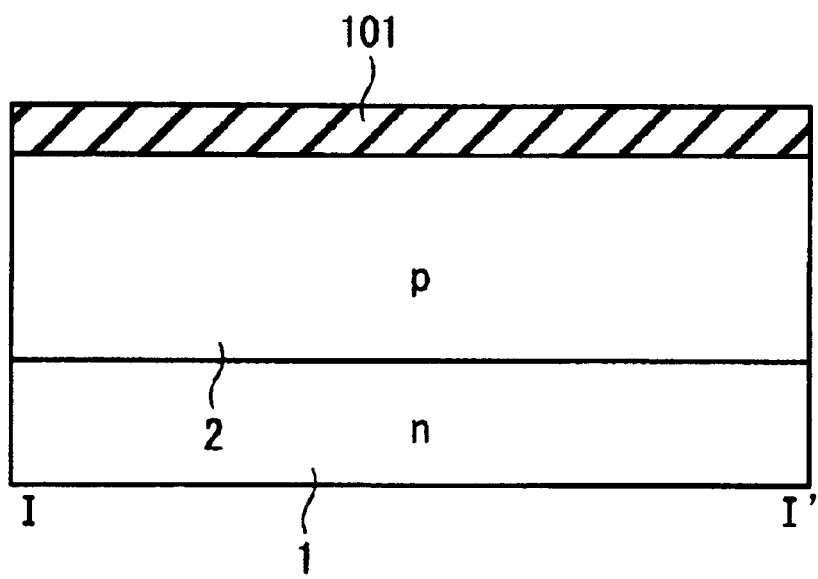
FIG. 4 shows a cross sectional view of a manufacturing step for forming a well in the first embodiment of the present invention.

We will explain manufacturing steps of the first embodiment in the present invention with reference to attached drawings. The manufacturing steps of the first embodiment will be mainly described with the I–I' cross sectional view. As shown in FIG. 4, a buffer oxide layer 101 is formed on the p-type well 2 by using a thermal oxide method. By using a well-known photolithography method, a resist layer (not shown) is then formed on the predetermined region so as to be able to achieve steps of a well ion injection and a channel ion injection. After the step of the ion injection necessary, a thermal step is done, thereby activating the ions injected and recovering defects that happened at the step of the ion injections. The p-type well 2 that has an optimized surface density of the ions (impurities) is formed in a cell array region.

Figure 5:
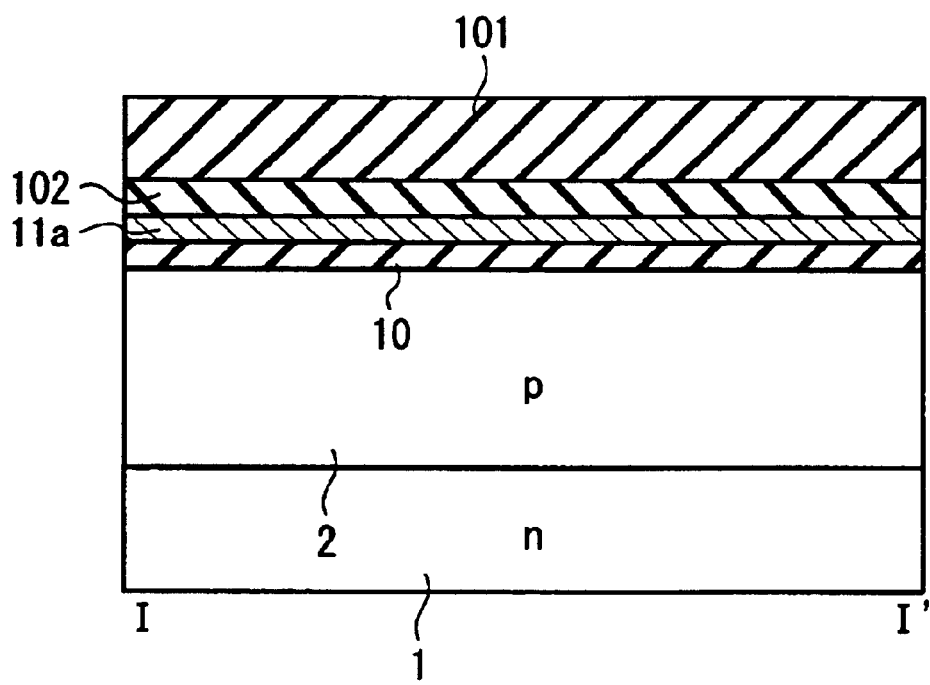
FIG. 5 shows a cross sectional view of a manufacturing step for forming a tunnel oxide film and a following manufacturing step of forming a mask layer by which element insulation isolation layers are formed in the first embodiment of the present invention.

After that, the buffer oxide layer 101 is removed by exposing into a solution including a fluorine acid. As shown in FIG. 5, a tunnel oxide layer 10 with 9 nm in thickness is formed on the p-type well 2. By using a LPCVD (Low Pressure Chemical Vapor Deposition) method, a poly crystalline silicon layer 11a with 40 nm in thickness, a silicon nitride layer (SiN) 102 with 100 nm in thickness, and a silicon oxide layer (SiO2) 103 with 200 nm in thickness are formed on the tunnel oxide layer 10, respectively.

Figure 6:
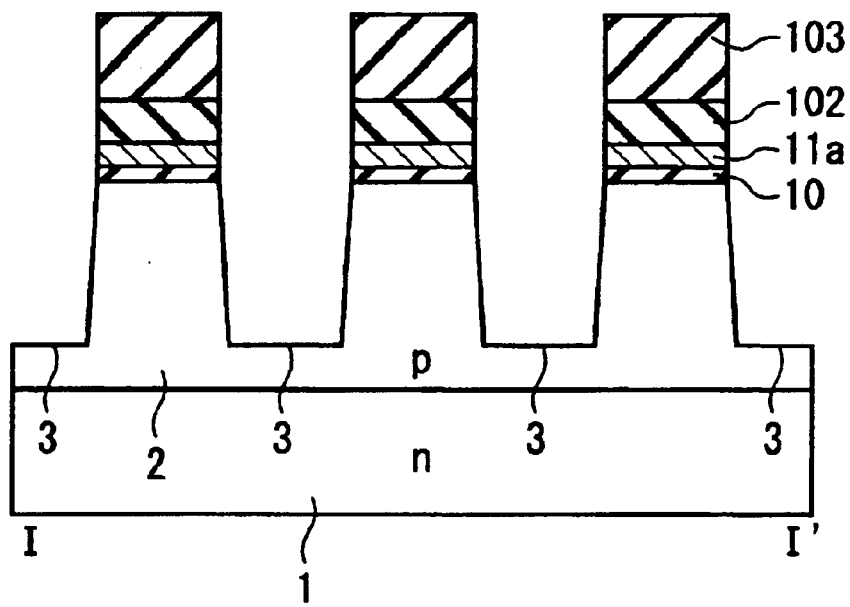
FIG. 6 shows a cross sectional view of a manufacturing step for forming trenches of element isolation in the first embodiment of the present invention.

By using a well-known photolithography method, a resist layer (not shown) is formed so as to be able to form STIs (Shallow Trench Isolations). As shown in FIG. 6, parts of the silicon oxide layer 103 (SiO2), the silicon nitride layer 102, the poly crystalline silicon layer 11a, the tunnel oxide layer 10, and the p-type well 2 are removed so as to form element isolation trenches 3 by using a RIE (Reactive Ion Etching) method.

Figure 7:
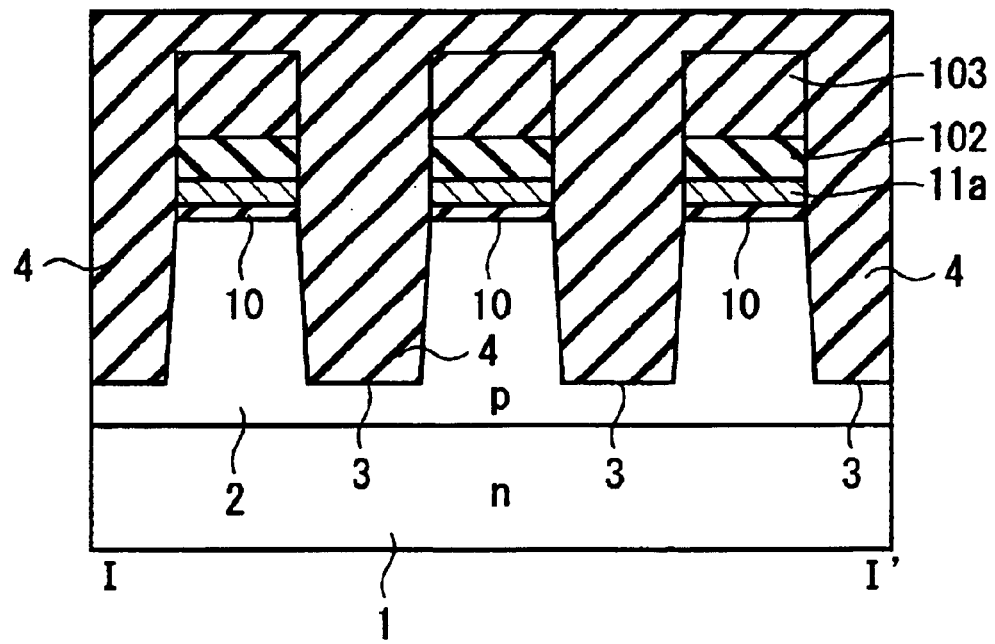
FIG. 7 shows a cross sectional view of a manufacturing step for forming a buried oxide layer which is element isolation insulation film in the first embodiment of the present invention.
Figure 8:
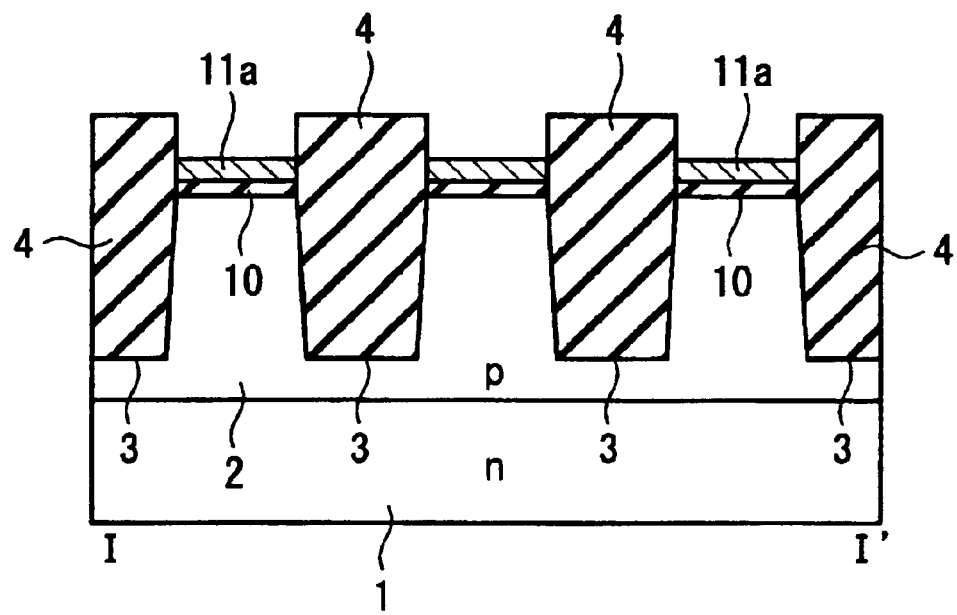
FIG. 8 shows a cross sectional view of a manufacturing step for forming the element isolation insulation films in the first embodiment of the present invention.

As shown in FIG. 7, the resist layer is removed by using an aching method. A silicon oxide layer SiO24 is then formed in the element isolation trenches 3 so as to fulfill the element isolation trenches 3. As shown in FIG. 8, the silicon oxide layer 4 is removed and flattened to expose an upper surface of the silicon nitride layer 102 by using a CMP (Chemical Mechanical Polishing) method. The silicon nitride layer 102 is then removed by exposing into a hot phosphorous acid.

Figure 9:
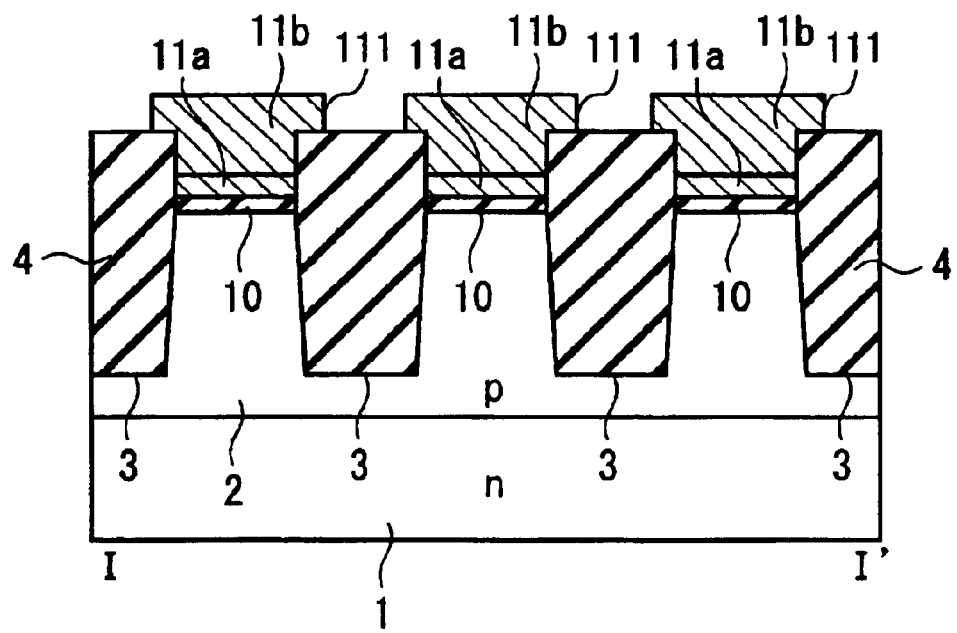
FIG. 9 shows a cross sectional view of a manufacturing step for forming poly crystalline silicon layers which are used as floating gates in the first embodiment of the present invention.

As shown in FIGS. 8 and 9, the removal of the silicon nitride layer 102 causes step shapes of the silicon oxide layer 4 (the element isolation insulation layer). A poly crystalline silicon layer 11a and 11b into which impurities are doped and that are used as a floating gate, are formed on the tunnel oxide layer 10 and the element isolation regions 4. A resist layer (not shown) is formed, and then, portions of the poly crystalline silicon layer 11b are etched and removed by using a well-known photolithography technique and a RIE method, thereby forming slit portions 111 (a opening portion) that electrically isolate the floating gate 13 in a direction parallel to the word line. After that, the resist layer is removed by an ashing method.

Figure 10:
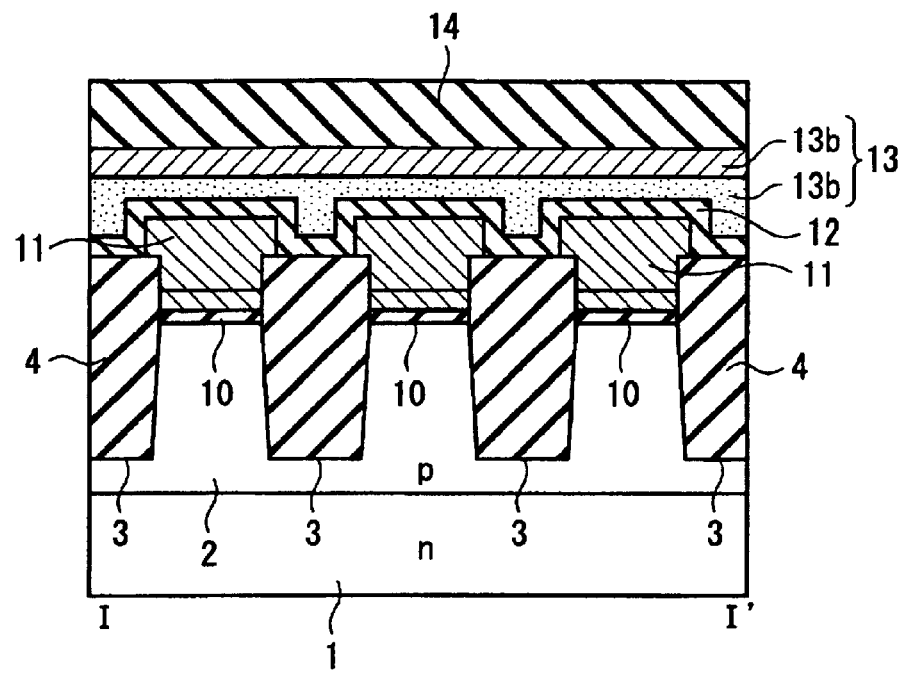
FIG. 10 shows a cross sectional view of a manufacturing step for forming control gates in the first embodiment of the present invention.
Figure 11:
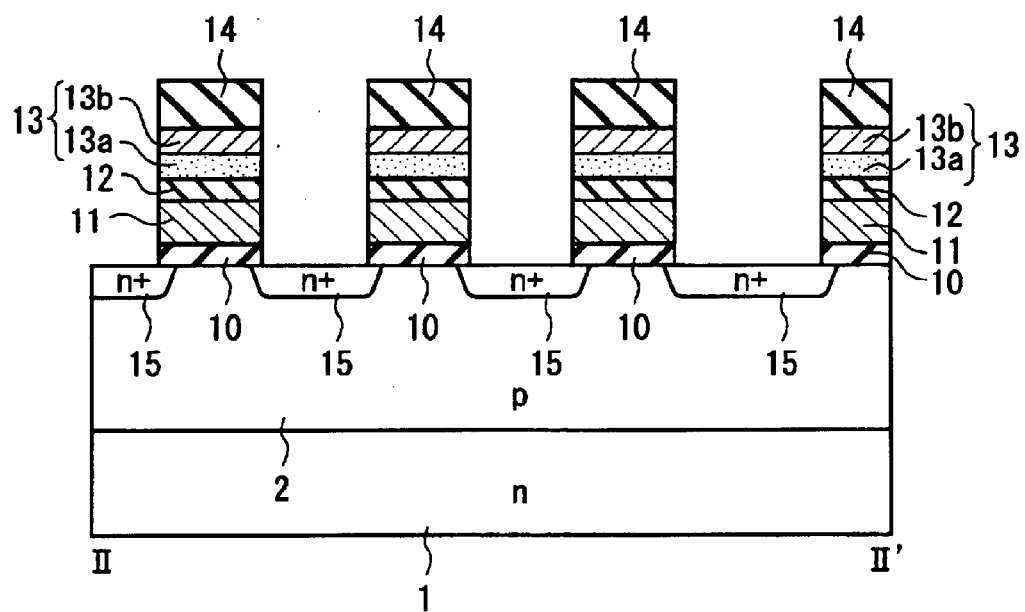
FIG. 11 shows a different cross sectional view of a manufacturing step for forming control gates in the first embodiment of the present invention.

FIG. 10 shows a cross sectional view of I–I', and FIG. 11 shows a different cross sectional view of II–II'. As shown in FIG. 10, an ONO (oxide nitride oxide) layer 12 that is used as a gate insulation film 12 is formed on the floating gates 11 and the element isolation insulation layers 3. An impurity doped poly crystalline silicon layer 13a, a tungsten silicide layer (WSi) 13b, and a silicon nitride layer (SiN) 14 are formed in order by using a LPCVD method. The impurity doped poly crystalline silicon layer 13a and the tungsten silicide layer (WSi) 13b are used as the control gate. As shown in FIG. 11, parts of the silicon nitride layer (SiN) 14, the impurity doped poly crystalline silicon layer 13a, the tungsten silicide layer (WSi) 13b, the gate insulation film 12, the floating gate 11, and the tunnel oxide film 10 are removed to form gate electrodes. N+ type diffusion layers 15 are formed in the p-type well 2 by using an ion injection method.

Figure 12:
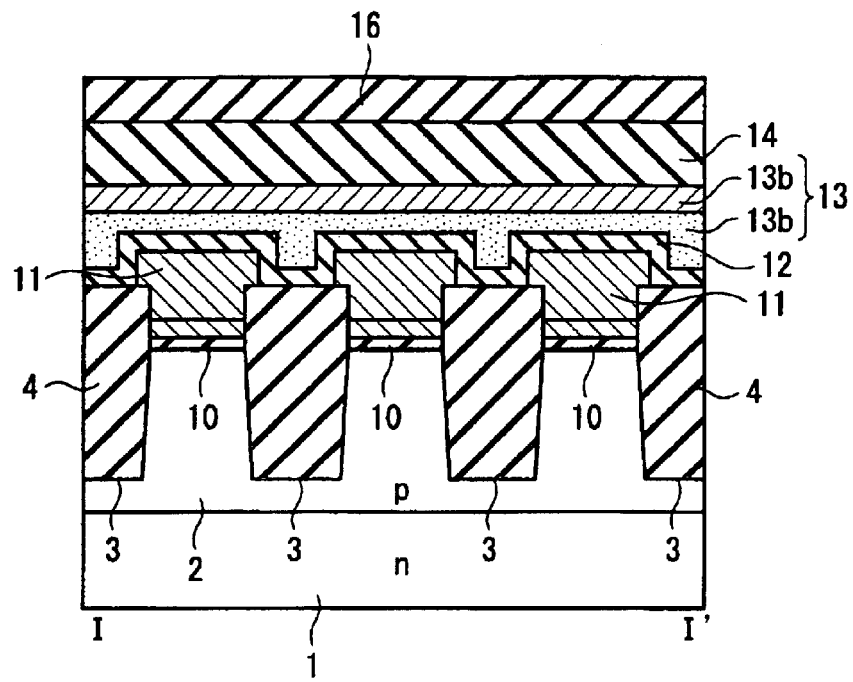
FIG. 12 shows a cross sectional view of a manufacturing step for forming interlayer insulation films in the first embodiment of the present invention.
Figure 13:
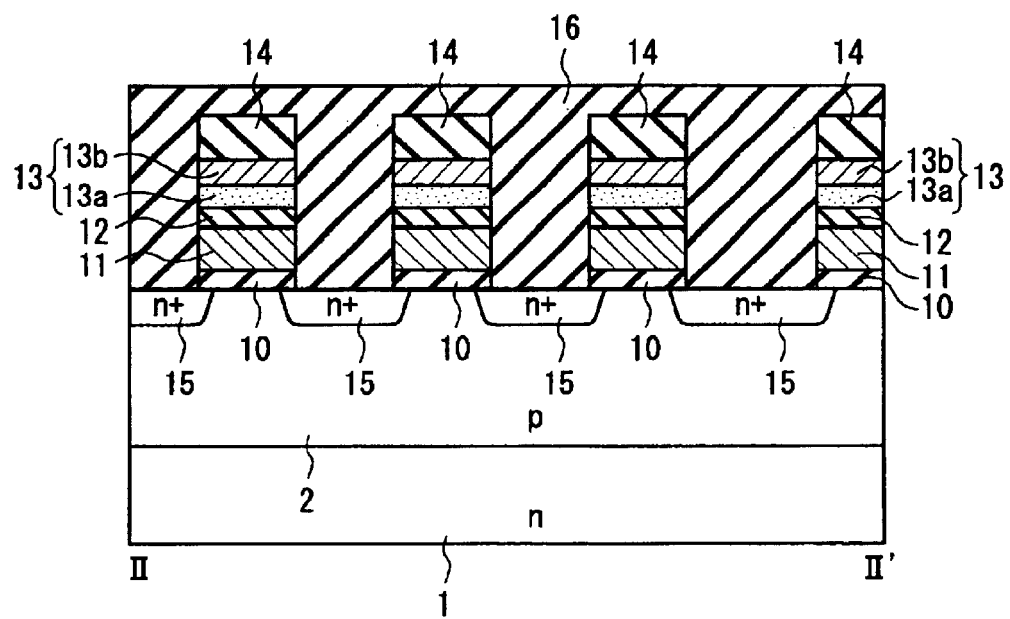
FIG. 13 shows a different cross sectional view of a manufacturing step for forming interlayer insulation films in the first embodiment of the present invention.
Figure 14:
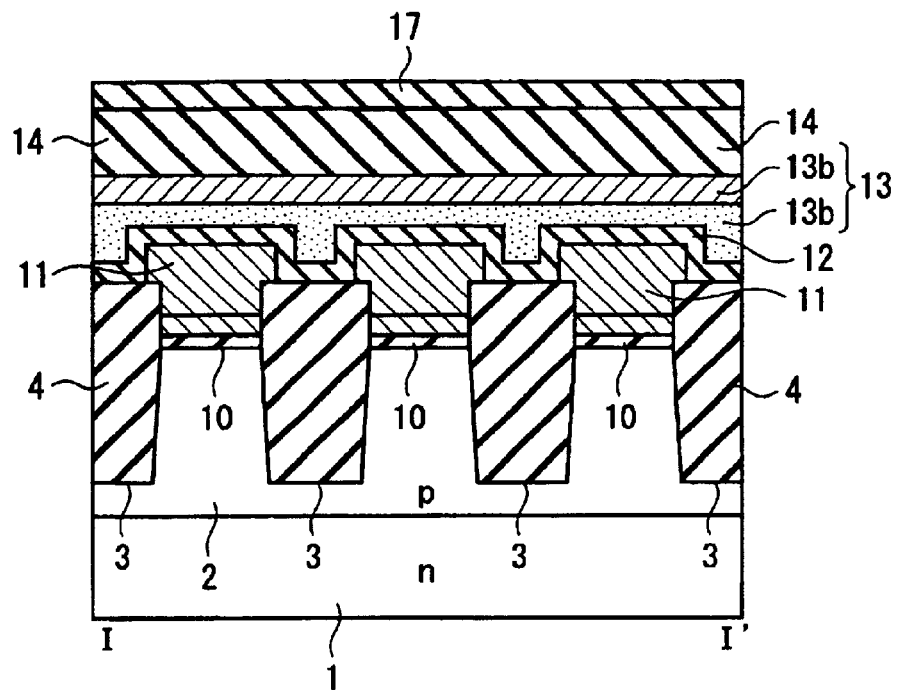
FIG. 14 shows a cross sectional view of a manufacturing step for annealing deuterium after covering the memory cell array with a silicon nitride layer in the first embodiment of the present invention.
Figure 15:
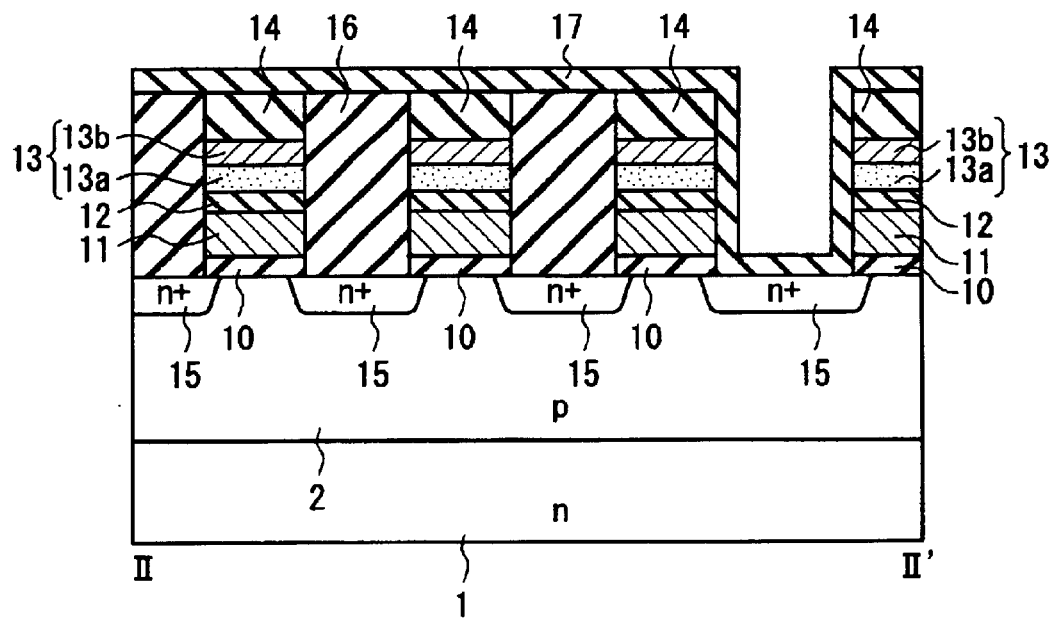
FIG. 15 shows a different cross sectional view of a manufacturing step for annealing deuterium after covering the memory cell array with a silicon nitride layer in the first embodiment of the present invention.

After that, as shown in FIGS. 12 and 13, a silicon oxide layer 16 is formed among the gate electrodes. And then, the silicon oxide layer 16 is removed and flattened so as to expose an upper surface of the silicon nitride layer 14 by using a CMP method. After that, a resist layer (not shown) with a predetermined pattern is formed on the silicon oxide layer 16. By using the resist layer with the predetermined pattern as a mask, parts of the silicon oxide layer 16 are removed to form contacts. As shown in FIGS. 14 and 15, a silicon nitride layer 17 is formed to cover the cell array region (the cell array). It should be noted that meaning of the cell array region or the cell array includes not only a whole memory cell array region, but also a portion of a region at which a plurality of memory cells are formed.

Hydrogen in the silicon nitride layers 14 and 17 is reduced at a state where the silicon nitride layers 14 and 17 cover the cell array region and contact opening portions. The reduction of hydrogen in the silicon nitride layers 14 and 17 is achieved by adding heat with, for instance, 900 degrees centigrade, 30 minutes, and an oxidation atmosphere (vapor atmosphere or mixture gas of hydrogen and oxygen). Thereby, not only surfaces of the silicon nitride layer 17 are oxidized, but also a density of hydrogen in the silicon nitride layers 14 and 17 is lowered.

And then, a step of a deuterium annealing is done with mixture gas of deuterium (D2) and nitrogen (N2), for instance, 600 degrees centigrade, and 30 minutes. By the deuterium annealing step, Si—H bonds in the tunnel oxide layer 10 are replaced with Si—D bonds, and deuterium in the silicon nitride layer 17 is diffused, thereby forming the Si—D bonds and the N—D bonds.

In the first embodiment of the present invention, the Si—D bonds and the N—D bonds in the silicon nitride layer 17 are formed effectively. Because the reduction of hydrogen in the silicon nitride layers 14 and 17 is done before deuterium are annealed. That is, a lot of dangling bonds can be formed in the silicon nitride layers 14 and 17 by removing hydrogen therefrom. And at this situation, deuterium are annealed, thereby terminating the dangling bonds in the silicon nitride layers 14 and 17 with the deuterium. At the same time, hydrogen within layers that are formed below the silicon nitride layers 14 and 17 are also replaced with the deuterium. From this reason, the layer that is located between the silicon nitride layer 17 and the semiconductor substrate 1 have a higher density of deuterium than that of deuterium that is supposed to be usually included.

From this reason, hydrogen within the silicon nitride layer 17 can be replaced with deuterium, thereby preventing the tunnel oxide layer from making replaced with hydrogen that are made left from the silicon nitride layer 17 at the heat adding step, and forming the Si—H bonding that causes the worse characteristic of the memory cell. Thereby, a reliability of the tunnel oxide layer 10 of the memory cell is increasing. The layer that is located between the silicon nitride layer 17 and the semiconductor substrate 1 contains deuterium, and an upper layer thereof is covered with the silicon layer 17. Therefore, deuterium can not move outside and keeps remaining in the layer, thereby allowing the tunnel oxide layer 10 to keep containing enough amount of deuterium until a final process. In other words, the layer that is located under the silicon nitride layer 17 is containing more deuterium than it is usually included. However, the layer that is located above the silicon nitride layer 17 is containing less deuterium than it is usually included.

It is noted that at the deuterium annealing step, the nitride layer that is formed on an opposite wafer side (a wafer side on which memory cells are not formed) is removed in advance, thereby resulting in making the opposite wafer side without the silicon nitride. Therefore, it is easy to make deuterium diffused from the opposite wafer side at the deuterium annealing step with deuterium atmosphere. Because, the deuterium annealing step with 600 degrees centigrade causes the deuterium to make diffused from the opposite wafer side to the wafer side on which the memory cells are formed.

As shown in FIGS. 2 and 3, an interlayer insulating film 20 of a BPSG is formed on the silicon nitride layers 14 and 17, and then an upper surface of the interlayer insulating film 20 is flattened by adding heat. A resist layer (not shown) with a predetermined pattern is formed on the interlayer insulating film 20 by using a well-known photolithography technique. A portion of the interlayer insulating film 20 is removed by using the patterned resist layer so as to expose an upper surface of the silicon nitride layer 17. It is noted that the silicon nitride layer 17 is also used as a stopper. After that, a portion of the silicon nitride layer 17 is removed, thereby forming a contact hole. A contact plug 21 of a non-doped poly crystalline silicon layer is formed in the contact hole. A tungsten (W) layer 22 that is electrically connected to the contact plug 21 is formed. Bit lines 25 made of aluminum are formed via an interlayer insulating film 23. A passivation layer is then formed on the interlayer insulating film 23. And then, portions of the passivation layer that are located at pad portions are removed, thereby forming the memory device.

Figure 16:
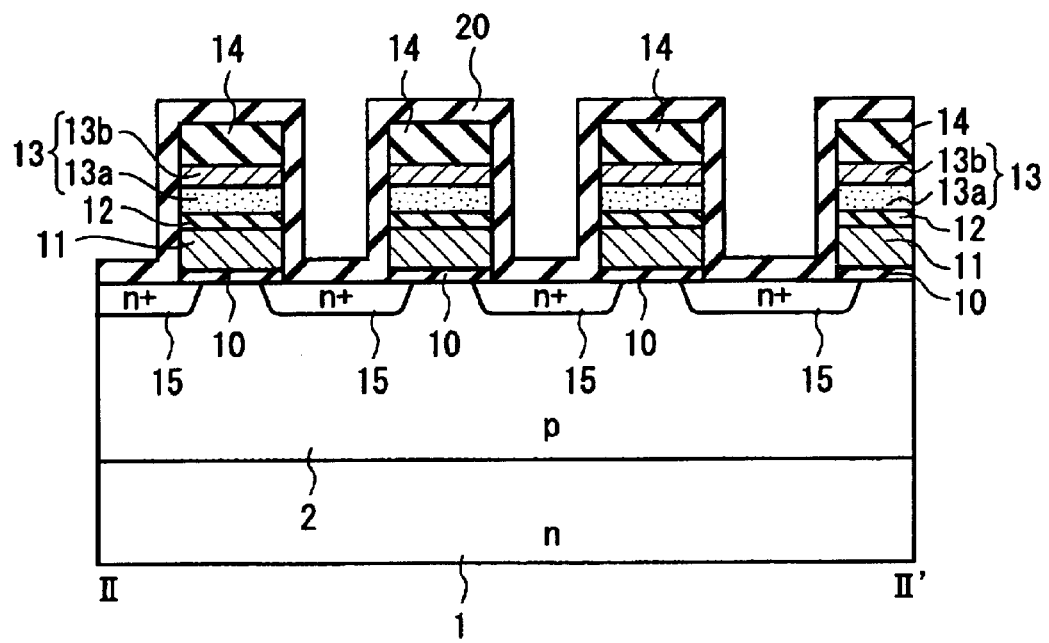
FIG. 16 shows a manufacturing step for forming an oxide layer after the steps shown in the FIGS. 10 and 11 in a second embodiment of the present invention.

In the first embodiment of the present invention, the silicon oxide layer 16 is formed among the gate electrodes. However, a silicon oxide layer/a silicon nitride layer/a BPSG layer may be formed among the gate electrodes. In this case, as shown in FIG. 16, instead of forming the thick silicon oxide layer 16 shown in FIGS. 12 and 13, a silicon oxide layer 20 are formed so as to cover the gate electrodes.

Figure 17:
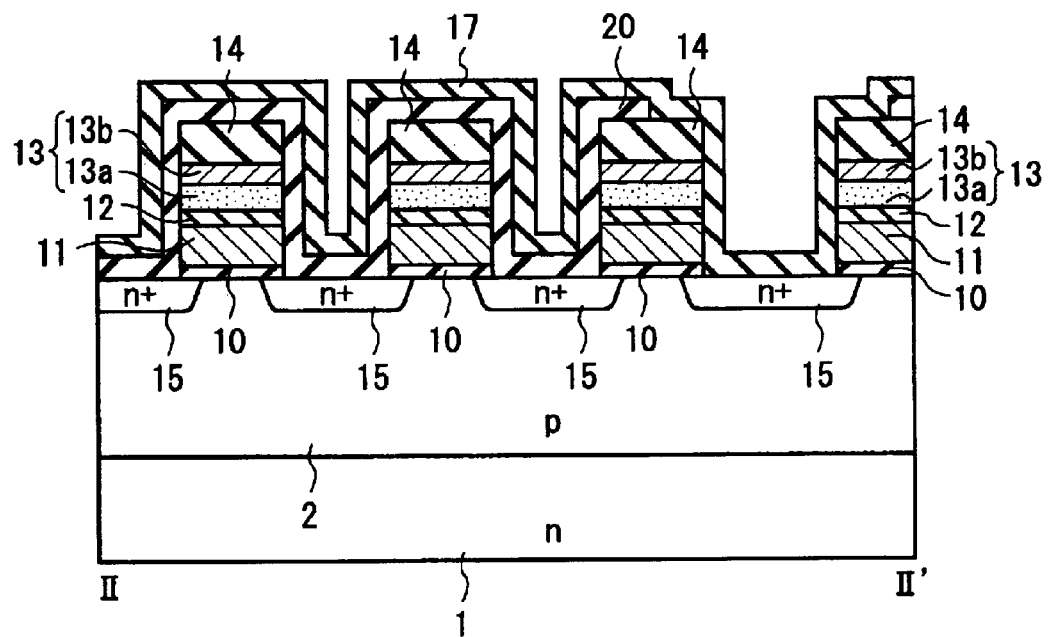
FIG. 17 shows a manufacturing step for forming a silicon nitride layer after the step shown in the FIG. 13 in the second embodiment of the present invention.

As shown in FIG. 17, portion of the silicon oxide layer 20 is removed to expose an upper surface of the diffusion layer 15. After that, a silicon nitride layer 17 is formed on an entire surface thereof. Similarly to a proceeding embodiment of the present invention, an interlayer insulating film (BPSG layer) is formed on the silicon nitride layer 17. Therefore, the silicon oxide layer/the nitride layer/the BPSG layer are formed among the gate electrodes.

It should be noted that the above-mentioned embodiments of the present invention is referred to as a NAND type of a nonvolatile memory device having a floating gate and a control gate. However, the nonvolatile memory device may be one of an AND type, a NOR type, and a DINOR types of the nonvolatile memory device.

Figure 18:
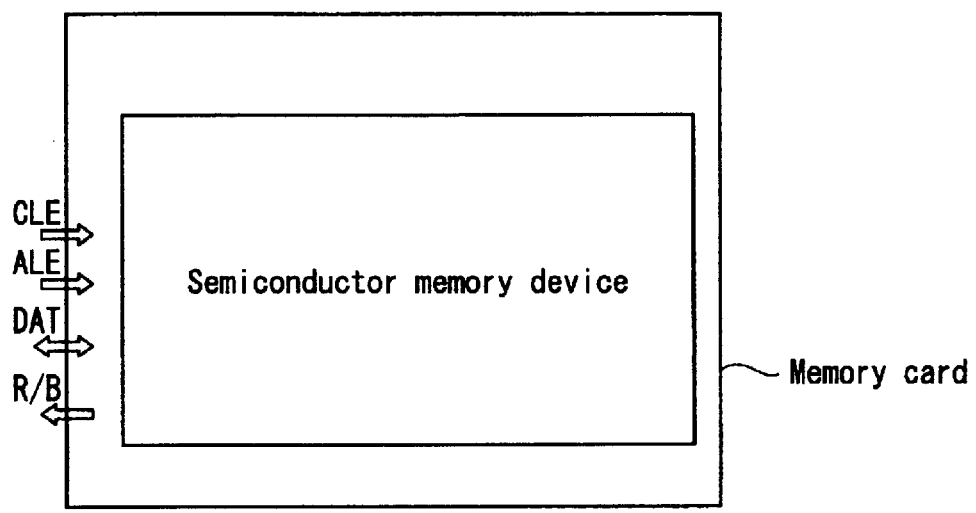
FIG. 18 shows a diagram of a memory card in which a semiconductor memory device is arranged.

We will explain about applications having an above-mentioned semiconductor memory device. A memory card having the above mentioned semiconductor memory device is shown in FIG. 18. As shown in FIG. 18, the semiconductor memory device receives/outputs predetermined signals and data from/to an external device (not shown).

Figure 19:
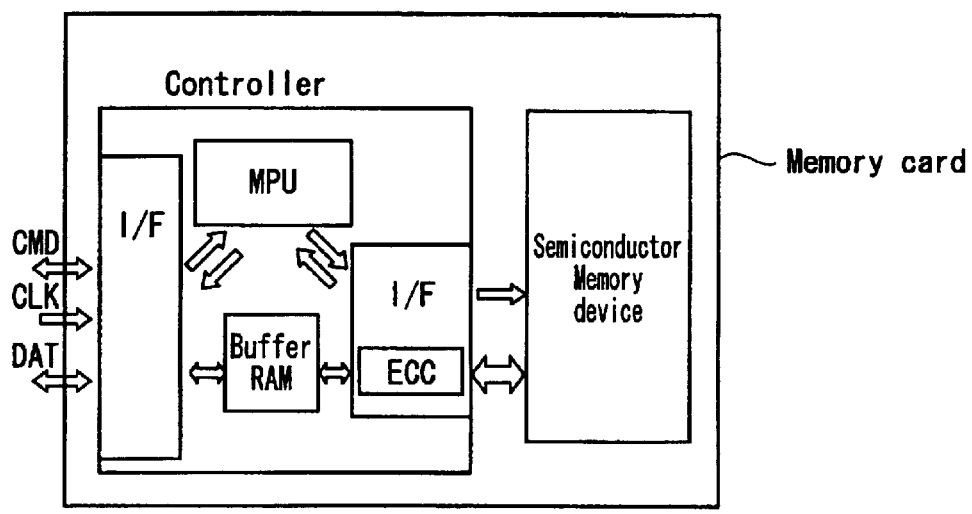
FIG. 19 shows a diagram of a memory card in which a semiconductor memory device and a controller are arranged.

A signal line (DAT), a command line enable signal line (CLE), an address line enable signal line (ALE) and a ready/busy signal line (R/B) are connected to the memory card having the above mentioned semiconductor memory device. The signal line (DAT) transfers data, address or command signals. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not. Another example of a memory card is shown in FIG. 19. The memory card shown in FIG. 19 differs from the memory card presented in FIG. 18 in that the memory card includes a controller which controls the semiconductor memory device and receives/transfers predetermined signals from/to an external device (not shown).

The controller includes an interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores data temporarily. The error correction code unit generates an error correction code. And a command signal line (CMD), a clock signal line (CLK) and a signal line (DAT) are connected to the memory card.

Although we explain about the memory cards as shown above, the number of the control signal lines, bit width of the signal line (DAT) and a circuit construction of the controller could be modified suitably.

Figure 20:
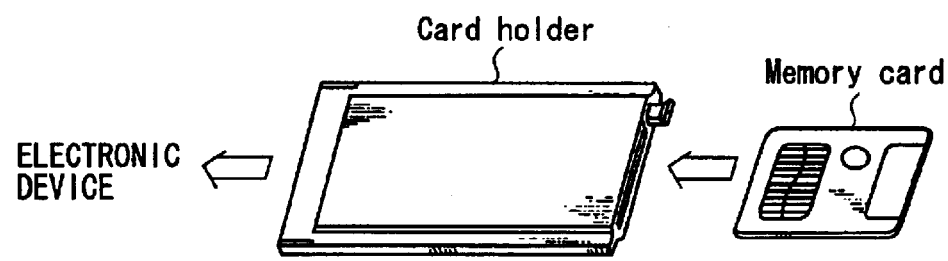
FIG. 20 shows a diagram of a card holder to which a memory card is inserted.

Another application is shown in FIG. 20. A memory card holder to which the memory card is inserted, is shown in FIG. 20. And the card holder is connected to electronic device (not shown). The card holder may have a part of the functions of the controller.

Figure 21:
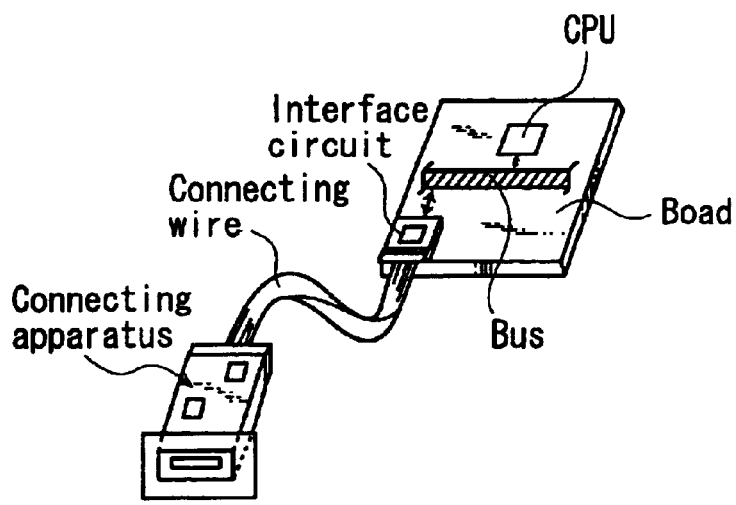
FIG. 21 shows a diagram of a connecting apparatus, a board, and a connecting wire.

Another application is shown in FIG. 21. As shown in FIG. 21, the memory card or the card holder to which the memory card is inserted, is inserted to a connecting apparatus. The connecting apparatus is connected to a board via a connecting wire and an interface circuit. The board has a CPU (Central Processing Unit) and a bus.

Figure 22:
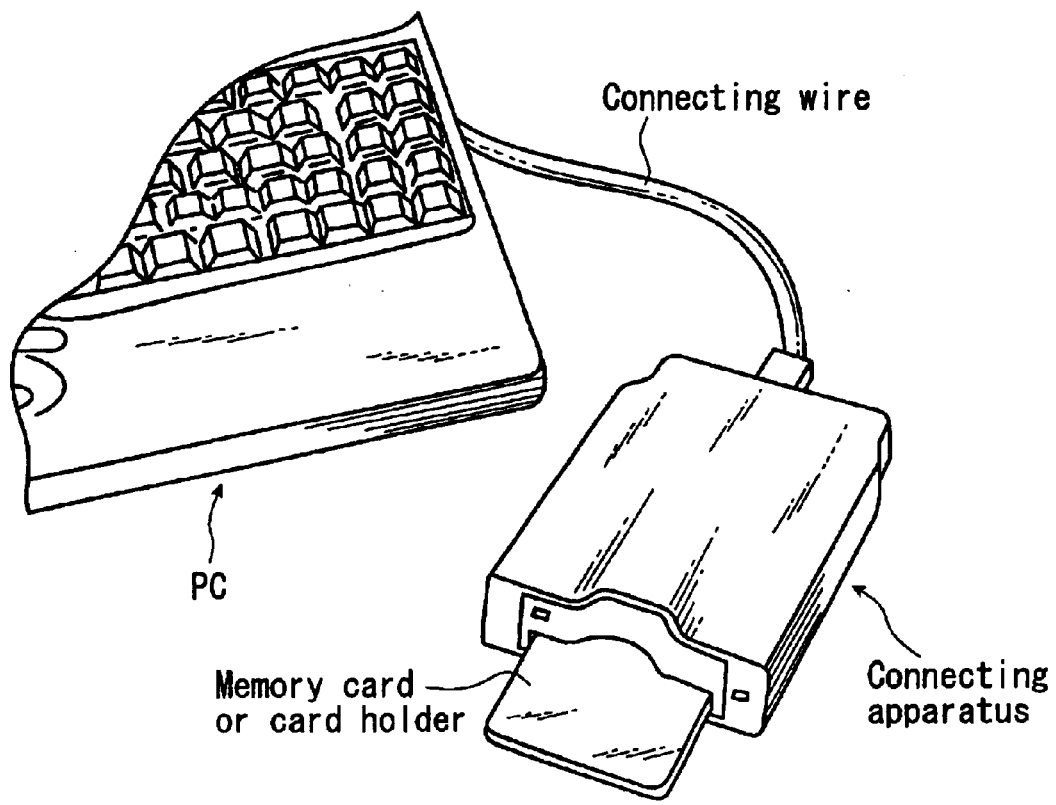
FIG. 22 shows a diagram of a PC, a connecting apparatus, and a connecting wire.

Another application is shown in FIG. 22. As shown in FIG. 22, the memory card or the card holder to which the memory card is inserted, is inserted to a connecting apparatus. The connecting apparatus is connected to PC (Personal Computer) via connecting wire.

Figure 23:
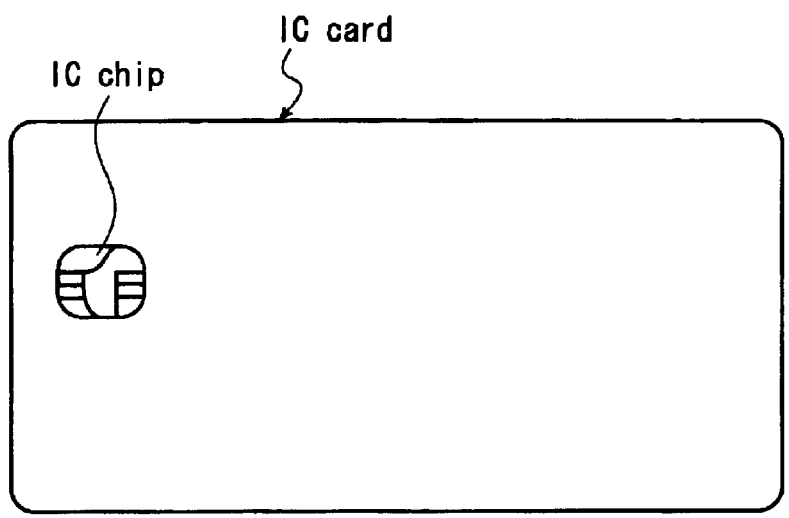
FIG. 23 shows a diagram of an IC chip including a semiconductor memory device, and an IC card on which the IC card is allocated.
Figure 24:
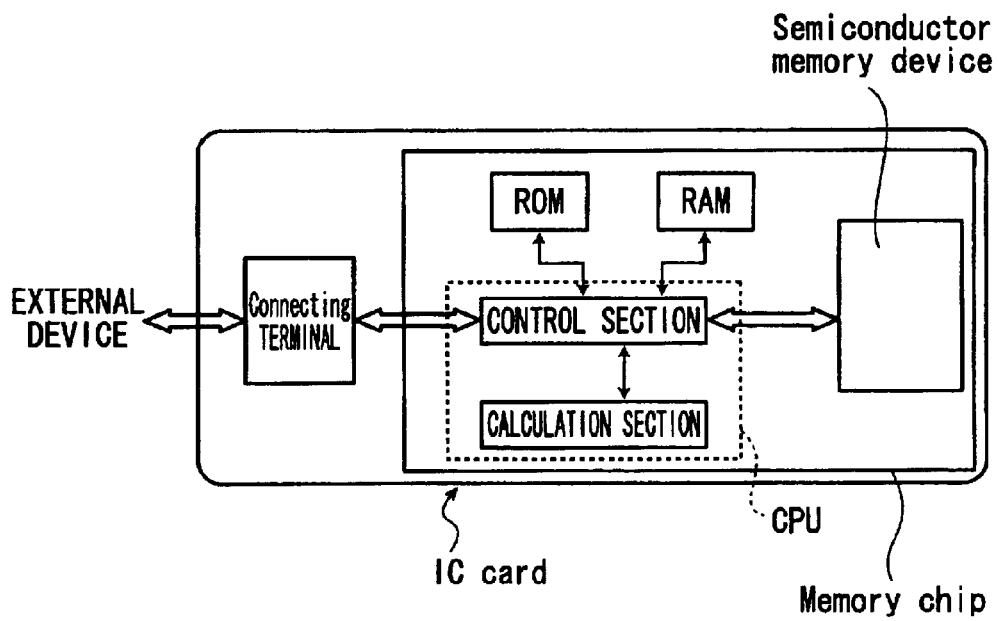
FIG. 24 shows a schematic diagram of an IC card and an IC chip.

Another application is shown in FIGS. 23 and 24. As shown in FIG. 23, An IC chip that includes the above-mentioned semiconductor memory device is located on an IC card that is made of plastic or something like that. FIG. 24 shows a detail block diagram of the IC card and the IC chip presented in FIG. 23. The IC chip has a connecting terminal that is configured to connect to an external device (not shown), and a memory chip that includes the above-mentioned semiconductor memory device, a ROM, a RAM, and a CPU. The CPU contains a calculation section and a control section that is configured to connect to the semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A semiconductor memory device having a gate insulation film, comprising:

a semiconductor substrate;

a memory cell array formed on the semiconductor substrate, the memory cell array including a plurality of memory cell transistors, each of which has the gate insulation film;

a first interlayer insulation film covering the memory cell array and including deuterium;

a silicon nitride layer formed above the first interlayer insulation film; and a second interlayer insulation film formed above the silicon nitride layer and including deuterium, a density of deuterium in the first interlayer insulation film being higher than that of deuterium in the second interlayer insulation film.

2. The semiconductor memory device having a gate insulation film according to claim 1, wherein the gate insulation film is a tunnel oxide film.

3. The semiconductor memory device having a gate insulation film according to claim 1, further comprising a conductive line formed on the second interlayer insulation film.

4. The semiconductor memory device having a gate insulation film according to claim 1, wherein the semiconductor memory device is a nonvolatile memory device.

5. The semiconductor memory device having a gate insulation film according to claim 1, wherein the semiconductor memory device includes one of a NAND type, an AND type, a NOR type, and a DINOR type of a nonvolatile memory device.

6. A memory card including the semiconductor memory device recited in claim 1.

7. A card holder to which the memory card recited in claim 6 is inserted.

8. A connecting device to which the memory card recited in claim 6 is inserted.

9. The connecting device according to the claim 8, wherein the connecting device is configured to be connected to a computer.

10. A memory card including the semiconductor memory device recited in claim 1 and a controller which controls the semiconductor memory device.

11. A card holder to which the memory card recited in claim 10 is inserted.

12. A connecting device to which the memory card recited in claim 10 is inserted.

13. The connecting device according to the claim 12, wherein the connecting device is configured to be connected to a computer.

14. An IC card on which an IC chip that includes the semiconductor memory device recited in claim 1 is located.

15. A semiconductor memory device having a gate insulation film, comprising:

a semiconductor substrate;

a memory cell array formed on the semiconductor substrate, the memory cell array including a plurality of memory cell transistors, each of which has the gate insulation film, a floating gate formed on the gate insulating film, and a control gate adjacent to the floating gate;

a first interlayer insulation film covering the memory cell array and including deuterium;

a silicon nitride layer formed above the first interlayer insulation film;

a second interlayer insulation film formed above the silicon nitride layer and including deuterium, a density of deuterium in the first interlayer insulation film being higher than that of deuterium in the second interlayer insulation film; and a bit line formed above the second interlayer insulation film.

16. The semiconductor memory device having a gate insulation film according to claim 15, wherein the gate insulation film is a tunnel oxide film.

17. The semiconductor memory device having a gate insulation film according to claim 15, further comprising a conductive line formed on the second interlayer insulation film.

18. The semiconductor memory device having a gate insulation film according to claim 15, wherein the semiconductor memory device is a nonvolatile memory device.

19. A memory card including the semiconductor memory device recited in claim 15.

20. A card holder to which the memory card recited in claim 19 is inserted.

21. A connecting device to which the memory card recited in claim 19 is inserted.

22. The connecting device according to the claim 21, wherein the connecting device is configured to be connected to a computer.

23. A memory card including the semiconductor memory device recited in claim 15 and a controller which controls the semiconductor memory device.

24. A card holder to which the memory card recited in claim 23 is inserted.

25. A connecting device to which the memory card recited in claim 23 is inserted.

26. The connecting device according to the claim 25, wherein the connecting device is configured to be connected to a computer.

27. An IC card on which an IC chip that includes the semiconductor memory device recited in claim 15 is located.

28. The semiconductor memory device having a gate insulation film according to claim 15, wherein the semiconductor memory device includes one of a NAND type, an AND type, a NOR type, and a DINOR type of a nonvolatile memory device.

* * * * *